United States Patent
Shin

(10) Patent No.: US 7,982,704 B2
(45) Date of Patent: *Jul. 19, 2011

(54) DATA DRIVING CIRCUIT AND ELECTROLUMINESCENT DISPLAY USING THE SAME

(75) Inventor: Dong Yong Shin, Seoul (KR)

(73) Assignee: Samsung Mobile Display Co., Ltd., Suwon-si, Gyeonggi-do (KR)

(*) Notice: Subject to any disclaimer, the term of this patent is extended or adjusted under 35 U.S.C. 154(b) by 1290 days.

This patent is subject to a terminal disclaimer.

(21) Appl. No.: 11/593,006

(22) Filed: Nov. 6, 2006

(65) Prior Publication Data

US 2007/0103389 A1 May 10, 2007

(30) Foreign Application Priority Data

Nov. 7, 2005 (KR) .................. 10-2005-0106171

(51) Int. Cl.
- *G09G 3/36* (2006.01)
- *G09G 3/12* (2006.01)
- *G09G 3/30* (2006.01)
- *G09G 5/00* (2006.01)

(52) U.S. Cl. ............. 345/100; 345/36; 345/76; 345/204

(58) Field of Classification Search .............. 345/36, 345/76–77, 100, 204–206

See application file for complete search history.

(56) References Cited

U.S. PATENT DOCUMENTS

| | | | |
|---|---|---|---|
| 6,339,631 B1 | 1/2002 | Yeo et al. | |
| 6,373,325 B1 | 4/2002 | Kuriyama | |
| 6,535,192 B1 | 3/2003 | Sung et al. | |
| 6,784,864 B1* | 8/2004 | Koyama et al. | 345/98 |
| 6,861,878 B2 | 3/2005 | Haruhana et al. | |
| 7,202,728 B2* | 4/2007 | Kondo | 327/389 |
| 7,782,276 B2* | 8/2010 | Shin | 345/76 |
| 7,808,471 B2* | 10/2010 | Shin | 345/100 |
| 2005/0264505 A1* | 12/2005 | Kim | 345/87 |
| 2007/0103389 A1 | 5/2007 | Shin | |
| 2007/0236421 A1* | 10/2007 | Shin | 345/76 |
| 2007/0240024 A1* | 10/2007 | Shin | 714/726 |

FOREIGN PATENT DOCUMENTS

| | | |
|---|---|---|
| EP | 1 783 739 A2 | 5/2007 |
| EP | 1 783 739 A3 | 5/2007 |
| JP | 2001-083923 A | 3/2001 |
| KR | 10-2001-0018731 A | 3/2001 |
| KR | 10-2004-0054427 A | 6/2004 |

\* cited by examiner

*Primary Examiner* — Bipin Shalwala
*Assistant Examiner* — Matthew A Fry
(74) *Attorney, Agent, or Firm* — Lee & Morse, P.C.

(57) ABSTRACT

A data driving circuit may include a shift register unit which may further include a plurality of first stages connected in series that may receive data signals and may output the data signals, in which each first stage may receive the data signals output from a preceding first stage, a latch unit including a plurality of second stages, in which each second stage may be connected to a different predetermined first stage, in which each second stage receives the data signals output from the predetermined first stage, in which the number of second stages may be substantially half the number of the first stages, and a D/A converter connected to the latch unit which may receive digital data signals and output analog data signals.

24 Claims, 10 Drawing Sheets

US 7,982,704 B2

DATA DRIVING CIRCUIT AND ELECTROLUMINESCENT DISPLAY USING THE SAME

BACKGROUND OF THE INVENTION

1. Field of the Invention

The present invention relates to a driving circuit for driving active matrix displays. More particularly, the present invention relates to a data driving circuit that applies a data signal to an electroluminescent display. The present invention also relates to an electroluminescent display.

2. Discussion of the Related Art

Active matrix displays, such as an electroluminescent display, may include a pixel array arranged in the form of a matrix composed of cross points between the data lines and the scan lines, i.e., a matrix pixel unit. That is, the data lines may constitute vertical lines (i.e., column lines) of the matrix pixel unit and the scan lines may constitute horizontal lines (i.e., row lines) of the matrix pixel unit. The data driving circuit may supply data signals into the matrix pixel unit at a predetermined time.

FIG. 1 illustrates a block diagram of an exemplary configuration of a data driving circuit. Referring to FIG. 1, a data driving circuit may include a shift register 10, a latch unit 20 and a D/A converter 30.

The shift register 10 may receive a start pulse (/CLK) and a clock (CLK) signal to generate a plurality of shift signals. The shift signals may be generated sequentially and transmitted to a latch unit 20. The latch unit 20 may receive data signals, e.g., video data, and the shift signals. A sampling latch may receive the data signals in series and may output the shift signals in parallel. Accordingly, a row of data signals may be simultaneously applied to a row of pixel units (not illustrated).

The D/A converter unit 30 may convert data signals, output as digital data signals from the latch unit 20, into analog data signals. The D/A converter unit 30 then may output the analog data signals to a pixel unit (not illustrated). The digital data signals converted into the analog data signals may be used to display colors according to a grey level ratio.

FIG. 2 illustrates a schematic of an exemplary configuration of a shift register, which may be used in the data driving circuit illustrated in FIG. 1.

Referring to FIG. 2, the shift register may use a master-slave flip/flop arrangement. In an exemplary operation, the shift register may receive and output signals when the clock is at a low level. Otherwise, the shift register may not output signals when the clock is at a high level.

In this exemplary circuit, a problem may exist because the inverters may output a static current when its input is at a low level. Also, the static current may be generated in half of the inverters inside the flip/flop. Therefore, the overall power consumption of the circuit may be increased since the number of inverters receiving a high-level input in the flip/flop may be the same as the number of inverters receiving a low level input.

A high level output voltage may be calculated by accounting for the voltage and a resistance that may exist between a supply voltage potential and ground, and the low level output voltage may be higher than a threshold voltage of a transistor, as illustrated in FIG. 2. In other words, the high level input voltage received at every stage may vary according to property deviations of the transistors. Therefore, the circuit may operate erroneously due to these level variations generated at the high level. Also, a low-level deviation of the output voltage may be represented by an ON resistance deviation of input transistors in the inverters illustrated in the circuit of FIG. 2, which may increase a high-level deviation of the input voltage. Transistors, for example, that may be employed in an electroluminescent display may make the above problems even worse due to the substantial property deviations that may exist.

Additionally, an inverter may charge an output port by allowing a current to flow through an input transistor to the output port. The output port may discharge by allowing a current to flow from the output port to a load transistor. Accordingly, a source-gate voltage of the load transistor may be gradually reduced when the output port is being charged. Therefore, the discharge current may fluctuate and the efficiency of the discharge may be deteriorated.

SUMMARY OF THE INVENTION

The present invention is therefore directed to a data driving circuit and an electroluminescent display employing the same, which substantially overcome one or more of the problems due to the limitations and disadvantages of the related art.

It is therefore a feature of an exemplary embodiment of the present invention to provide a data driving circuit that may be capable of reducing a power consumption by removing paths through which a static current may flow, and switching an output voltage at the range from a positive power supply voltage to a negative power supply voltage using a bootstrap technique, since a shift register may include a plurality of PMOS or NMOS transistors and a capacitor, and may be operated by 2-phase clock signals, and an electroluminescent display using the same.

At least one of the above and other features and advantages of the present invention may be realized by providing a data driving circuit that may include a shift register unit, which may further include a plurality of first stages that may be connected in series and may receive data signals and output the data signals, in which each first stage may receive the data signals output from a preceding first stage, and a latch unit that may include a plurality of second stages, in which each second stage may be connected to a different predetermined first stage and may receive the data signals output from the predetermined first stage, in which the number of second stages may be substantially half the number of the first stages.

The predetermined first stage may be an even-numbered first stage. The predetermined first stage may be an odd-numbered first stage.

Each first stage may be connected to a first clock and a second clock and receives a first clock signal and a second clock signal as input, in which each first stage may store data signals when a first and a second clock signals may be identical to each other and may output the stored data signals when the first and the second clock signals may be different from each other.

The first stage may include a first transistor connected between an input port and a first node and being turned on based on the second clock, a second transistor connected between the first clock and a second node and being turned on based on a voltage of the first node, a third transistor connected between a first power supply and a third node and being turned on based on the second clock, a fourth transistor connected between the second clock and the third node and being turned on based on the voltage of the first node, a fifth transistor connected between a second power supply and an output port and being turned on based on the voltage of the third node and a first capacitor connected between the first node and the output port and maintaining the voltages of the output port and the first node.

Each first stage may include PMOS transistors or NMOS transistors.

The first and the second clock signals may include a data-reading period and a data-transmitting period, and the data-reading period may be shorter than the data-transmitting period. The second clock signal may be analogous to a delayed first clock signal.

Each second stage may receive a first enable signal and a second enable signal that may be input at a same period, in which each second stage may store data signals when the first and the second enable signals may be identical to each other and may output the stored data signals when the first and the second enable signals may be different from each other.

The second stage may include a sixth transistor connected between an input port and a fourth node and being turned on based on the first enable signal generator, a seventh transistor connected between a second enable signal generator and a fifth node and being turned on based on a voltage of the fourth node, an eighth transistor connected between a first power supply and a sixth node and being turned on based on the first enable signal generator, a ninth transistor connected between the first enable signal generator and the sixth node and based on the voltage of the fourth node, a tenth transistor connected between the second power supply and an output port and being turned on based on a voltage of the sixth node, and a second capacitor connected between the forth node and the output port and maintaining the voltages of the output port and the fourth node.

Each second stage may include PMOS transistors or NMOS transistors.

The second stages may simultaneously output data signals in parallel based on the first and the second enable signals.

The first and the second enable signals may have waveforms of the first clock signal and the second clock signal at an applied point.

The data driving circuit may include a D/A converter connected to the latch unit, in which the D/A converter may receive the digital data signals from the latch unit and output analog data signals.

At least one of the above and other features and advantages of the present invention may be realized by providing an electroluminescent display that may include a pixel unit, which further includes pixels receiving data signals and scan signals, a scan driving circuit transmitting the data signals to the pixels, and a data driving circuit transmitting the scan signals to the pixels, in which the data driving circuit may include a shift register unit, which may further include a plurality of first stages that may be connected in series and may receive data signals and output the data signals, in which each first stage may receive the data signals output from a preceding first stage, and a latch unit that may include a plurality of second stages, in which each second stage may be connected to a different predetermined first stage and may receive the data signals output from the predetermined first stage, in which the number of second stages may be substantially half the number of the first stages.

The predetermined first stage may be an even-numbered first stage. The predetermined first stage may be an odd-numbered first stage.

Each first stage may be connected to a first clock and a second clock and receives a first clock signal and a second clock signal as input, in which each first stage may store data signals when a first and a second clock signals may be identical to each other and may output the stored data signals when the first and the second clock signals may be different from each other.

The first stage may include a first transistor connected between an input port and a first node and being turned on based on the second clock, a second transistor connected between the first clock and a second node and being turned on based on a voltage of the first node, a third transistor connected between a first power supply and a third node and being turned on based on the second clock, a fourth transistor connected between the second clock and the third node and being turned on based on the voltage of the first node, a fifth transistor connected between a second power supply and an output port and being turned on based on the voltage of the third node and a first capacitor connected between the first node and the output port and maintaining the voltages of the output port and the first node.

The first and the second clock signals may include a data-reading period and a data-transmitting period, and the data-reading period may be shorter than the data-transmitting period. The second clock signal may be analogous to a delayed first clock signal.

Each second stage may receive a first enable signal and a second enable signal that may be input at a same period, in which each second stage may store data signals when the first and the second enable signals may be identical to each other and may output the stored data signals when the first and the second enable signals may be different from each other.

The second stage may include a sixth transistor connected between an input port and a fourth node and being turned on based on the first enable signal generator, a seventh transistor connected between a second enable signal generator and a fifth node and being turned on based on a voltage of the fourth node, an eighth transistor connected between a first power supply and a sixth node and being turned on based on the first enable signal generator, a ninth transistor connected between the first enable signal generator and the sixth node and based on the voltage of the fourth node, a tenth transistor connected between the second power supply and an output port and being turned on based on a voltage of the sixth node, and a second capacitor connected between the forth node and the output port and maintaining the voltages of the output port and the fourth node.

The second stages may simultaneously output data signals in parallel based on the first and the second enable signals.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
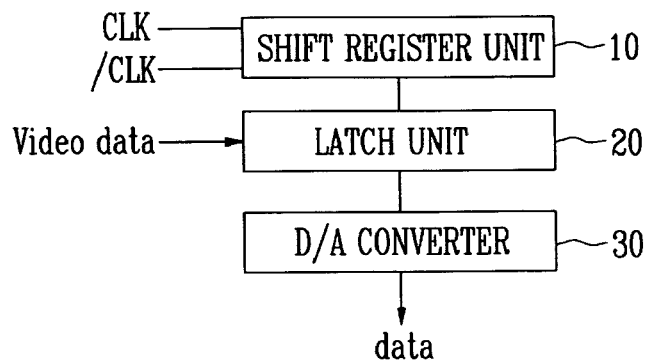
FIG. 1 illustrates a block diagram of an exemplary configuration of a data driving circuit.
Figure 2:
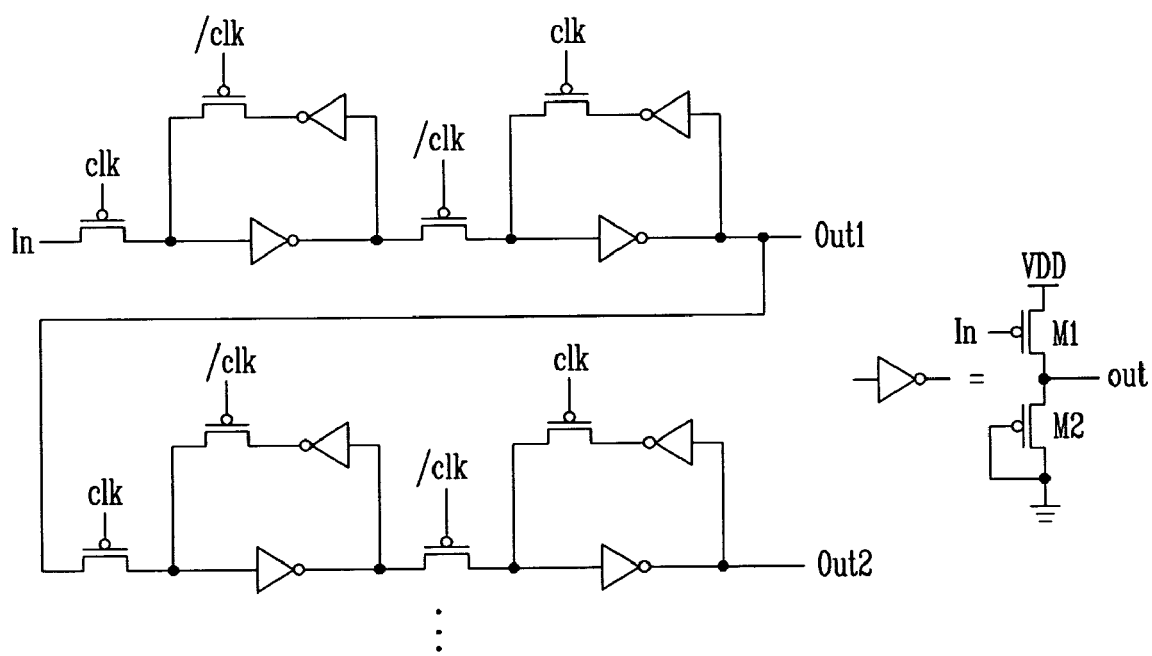
FIG. 2 illustrates a schematic of an exemplary configuration of a shift register that may be used in the data driving circuit illustrated in FIG. 1.

Korean Patent Application No. 10-2005-0106171, filed on Nov. 7, 2005, in the Korean Intellectual Property Office, and entitled: "Data Driving Circuit and Organic Light Emitting Display Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of elements may be exaggerated for clarity of illustration. Like reference numerals refer to like elements throughout.

Figure 3:
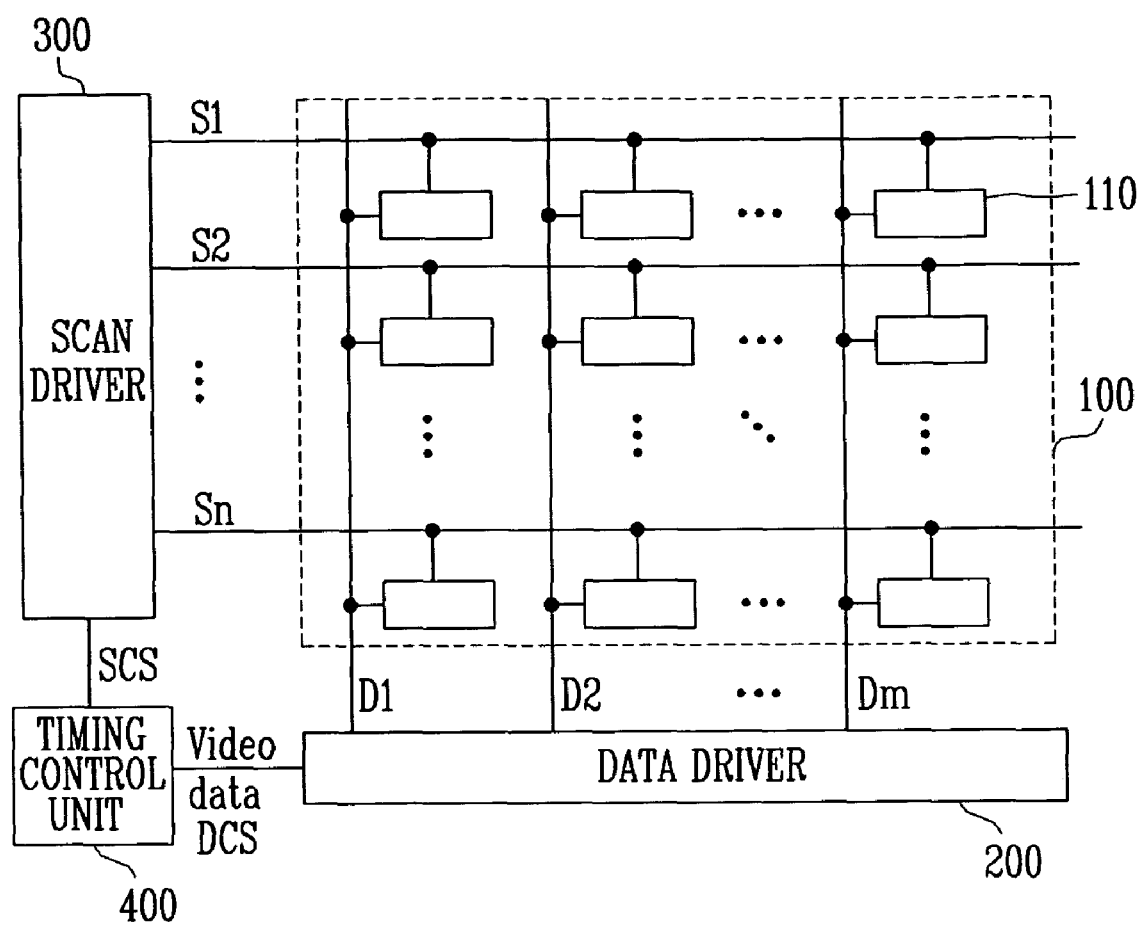
FIG. 3 illustrates a schematic of an exemplary configuration of an electroluminescent display according to an exemplary embodiment of the present invention.

FIG. 3 illustrates a schematic of an exemplary configuration of an organic light-emitting display (OLED) according to one exemplary embodiment of the present invention. However, it should be understood that an OLED is considered a particular type of an electroluminescent display and should not limit the scope of this invention. Rather, the OLED is being presented as an example of an electroluminescent display for the purposes of illustration and discussion only. Furthermore, the OLED itself is exemplary in nature and the discussion herein should not limit the implementation of such a display, including components utilized, operations performed and connections thereto. Referring to FIG. 3, the OLED may have a pixel unit 100, including a plurality of pixels 110 connected with scan lines S1 to Sn and data lines D1 to Dm, a data driving circuit 200 for driving the data lines D1 to Dm, a scan driving circuit 300 for driving the scan lines S1 to Sn, and a timing control unit 400 for controlling the scan driving circuit 300 and the data driving circuit 200.

The pixel unit 100 may receive a first power supply (ELVDD) and a second power supply (ELVSS) from an external source (not illustrated), and may supply the power to each of pixels 110. Each of the pixels 110 receiving the first power supply (ELVDD) and the second power supply (ELVSS) may generate a light corresponding to data signals by controlling a current flowing from the first power supply (ELVDD) to the second power supply (ELVSS) via, for example, a light-emitting diode (not illustrated), that corresponds to the data signals.

The data driving circuit 200 may receive data-driving control signals (DCS) from the timing control unit 400. The data driving circuit 200 receiving the data-driving control signals (DCS) may generate data signals, and may supply the generated data signals to data lines D1 to Dm so that they may be synchronized with the scan signals. The data driving circuit 200 may include a plurality of switching elements. The switching elements may or may not be all the same type. For example, the switching elements may be realized by PMOS transistors, NMOS transistors or other suitable components, either exclusively, respectively or combinations thereof.

The scan driving circuit 300 may receive scan-driving control signals (SCS) from the timing control unit 400. The scan driving circuit 300 receiving the scan-driving control signals (SCS) may generate scan signals and may sequentially supply the generated scan signals to scan lines S1 to Sn. That is, the scan driving circuit 300 may operate to sequentially generate scan signals and supply the generated scan signals to a pixel unit 100 which may drive a plurality of the pixels.

The timing control unit 400 may generate data-driving control signals (DCS) and scan-driving control signals (SCS) to correspond to synchronizing signals which may be supplied from an external source (not illustrated). The DCS generated in the timing control unit 400 may be supplied to the data driving circuit 200 and the SCS may be supplied to the scan driving circuit 300. The timing control unit 400 may also supply DATA, which may be generated from an external source (not illustrated), to the data driving circuit 200. Such the data driving unit may be used in liquid crystal display device, etc.

Figure 4:
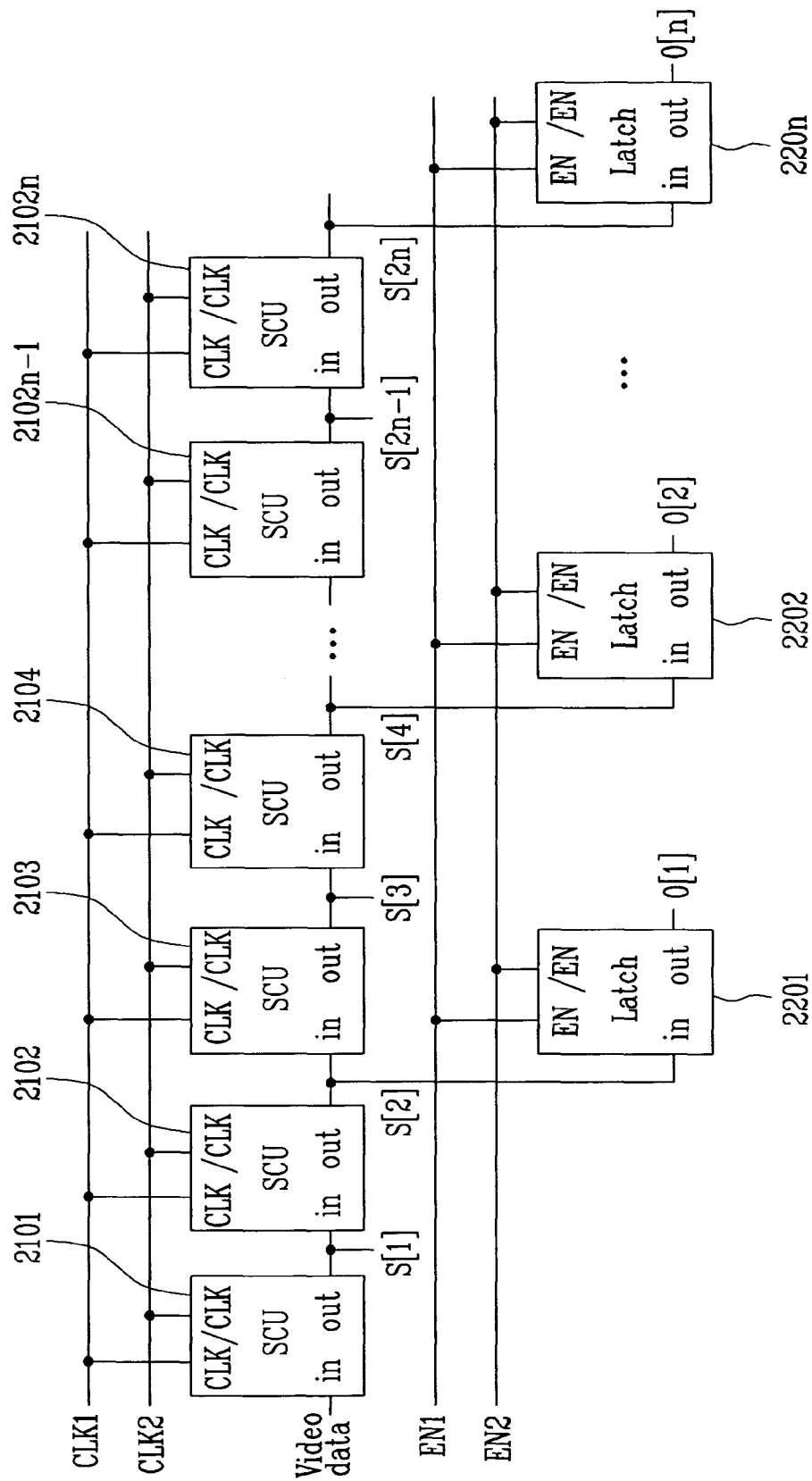
FIG. 4 illustrates a schematic of an exemplary data driving circuit that may be used by the electroluminescent display illustrated in FIG. 3, according to an exemplary embodiment of the present invention.

FIG. 4 illustrates a schematic of an exemplary data driving circuit that may be used with the exemplary OLED illustrated in FIG. 3, according to an exemplary embodiment of the present invention. However, it should be understood that the exemplary data driving circuit should not be limited to the exemplary OLED of FIG. 3. Rather, the exemplary data driving circuit may be used with other electroluminescent displays. Referring to FIG. 4, the data driving circuit 200 may include a shift register and a latch unit.

The shift register may include a plurality of first stages 2101 to 2102n, and each of the first stages may be operated by a first clock (CLK1) and a second clock (CLK2), and then the first stage 2101 may output a $1^{st}$ carrier wave (s[1]) and may transmit the $1^{st}$ carrier wave (s[1]) to a $2^{nd}$ first stage 2102. Data signals (for example, video data) may be output with the $1^{st}$ carrier wave (s[1]). The $2^{nd}$ first stage 2102 may receive the $1^{st}$ carrier wave, and then may transmit the $2^{nd}$ carrier wave to a $3^{rd}$ first stage and a $1^{st}$ second stage 2201, and then the $3^{rd}$ first stage may transmit a $3^{rd}$ carrier wave to the $4^{th}$ first stage 2104. That is, the even-numbered first stages 2102, 2104 . . . 2102n-2, 2102n may transmit carrier waves to the adjacent first stages (the odd-numbered first stage 2103, 2105 . . . 2102n-3, 2102n-1) and the second stages.

The latch unit may include a plurality of the second stages 2201 to 220n, and each of the second stages may be operated by a first enable signal (EN1), a second enable signal (EN2) which may be supplied by first and second enable signal generators. The plurality of the second stages 2201 to 220n may be connected to output lines of the even-numbered first stages 2102, 2104 . . . 2102n-2, 2102n to receive data signal (a1 to an) transmitted from the even-numbered first stages 2102, 2104, . . . 2102n-2, 2102n to the carrier waves (s2, s4, . . . s2n-2,s2n). Accordingly, a plurality of the second stages 2201 to 220n may be half the number of the plurality of the first stages 2101 to 2102n. Also, each of the second stages may simultaneously output the data signals (for example, video data) based on the first enable signal (EN1) and the second enable signal (EN2). Accordingly, the data signals (for example, video data) may be input in series to a plurality of the first stages 2101 to 2102n and may be output in parallel by a plurality of the second stages 2201 to 220n.

Figure 5:
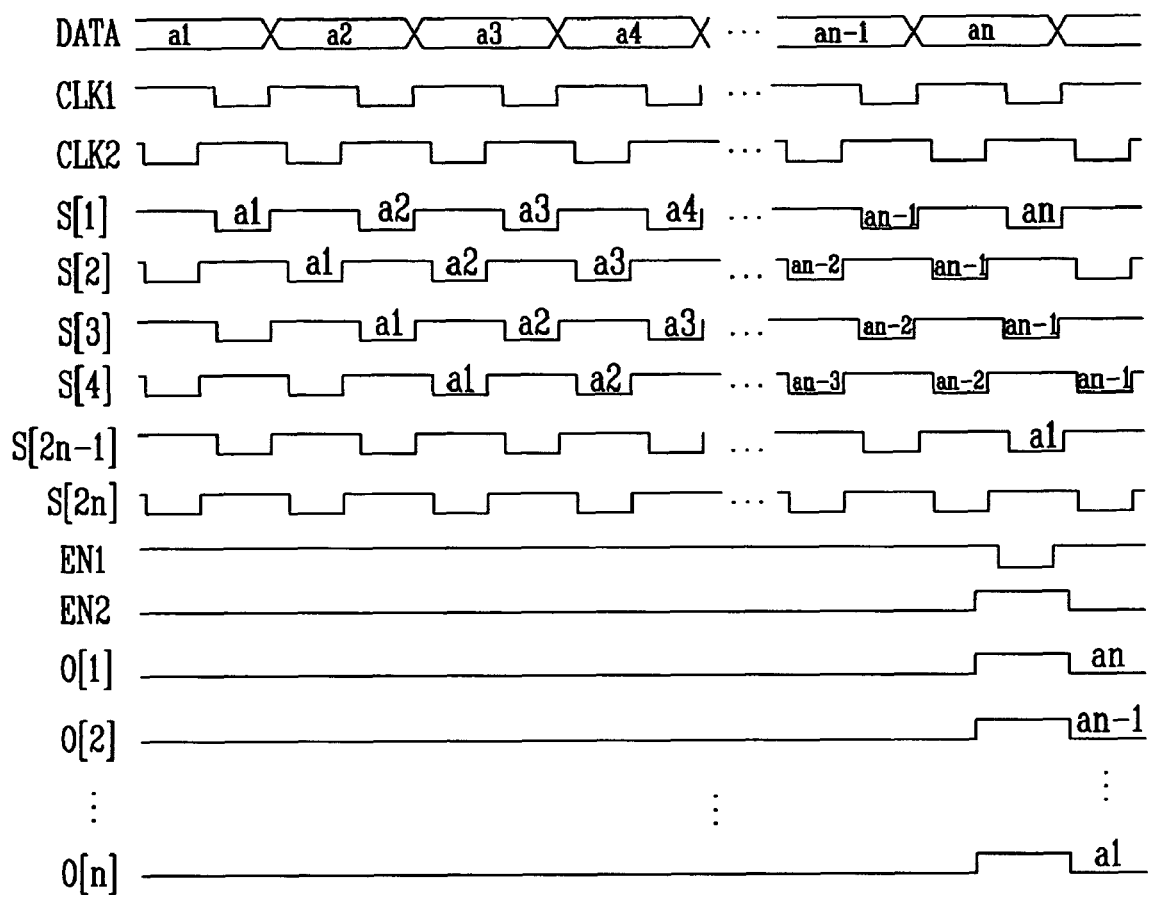
FIG. 5 illustrates a timing diagram of an exemplary operation of the data driving circuit illustrated in FIG. 4.

FIG. 5 illustrates a timing diagram of an exemplary operation of the data driving circuit illustrated in FIG. 4. Referring to FIG. 5, the first clock CLK1 may be a pulse that may be periodically generated and may have a longer high period and a shorter low period. The second clock (CLK2) may also be a pulse that is delayed for a predetermined period compared to the first clock (CLK1). The carrier wave (s1) outputs from the $1^{st}$ first stage 2101 may be generated with the same periodicity as the first clock (CLK1), and the carrier wave (s1) outputs the $1^{st}$ data (a1) when the signal is at a low level. The $1^{st}$ first stage 2101 that may receive the input data serially, may continue to sequentially output a n-th data of the $1^{st}$ data (a1) over the carrier wave (s[1]). In turn, the $2^{nd}$ first stage 2102 receives the $1^{st}$ carrier wave from the $1^{st}$ first stage 2101, and then outputs the $2^{nd}$ carrier wave (s2). Therefore, the $2^{nd}$ carrier wave (s2) outputs the $1^{st}$ data (a1) after the $1^{st}$ data (a1) is delayed for a predetermined time compared to the $1^{st}$ carrier wave (s1), and sequentially outputs the data from the $1^{st}$ data (a1) to the $n^{th}$ data (an). In this manner, the $n^{th}$ carrier wave (sn) outputs the data from the $1^{st}$ data (a1) to the $n^{th}$ data (an). The first and second enable signals (EN1, EN2) may be input at a point that the $1^{st}$ data (a1) to $n^{th}$ data (an) are output over the $n^{th}$ carrier wave (sn) of the $1^{st}$ carrier wave (s1), and then output simultaneously by a plurality of the second stages 2201 to 220n.

Figure 6:
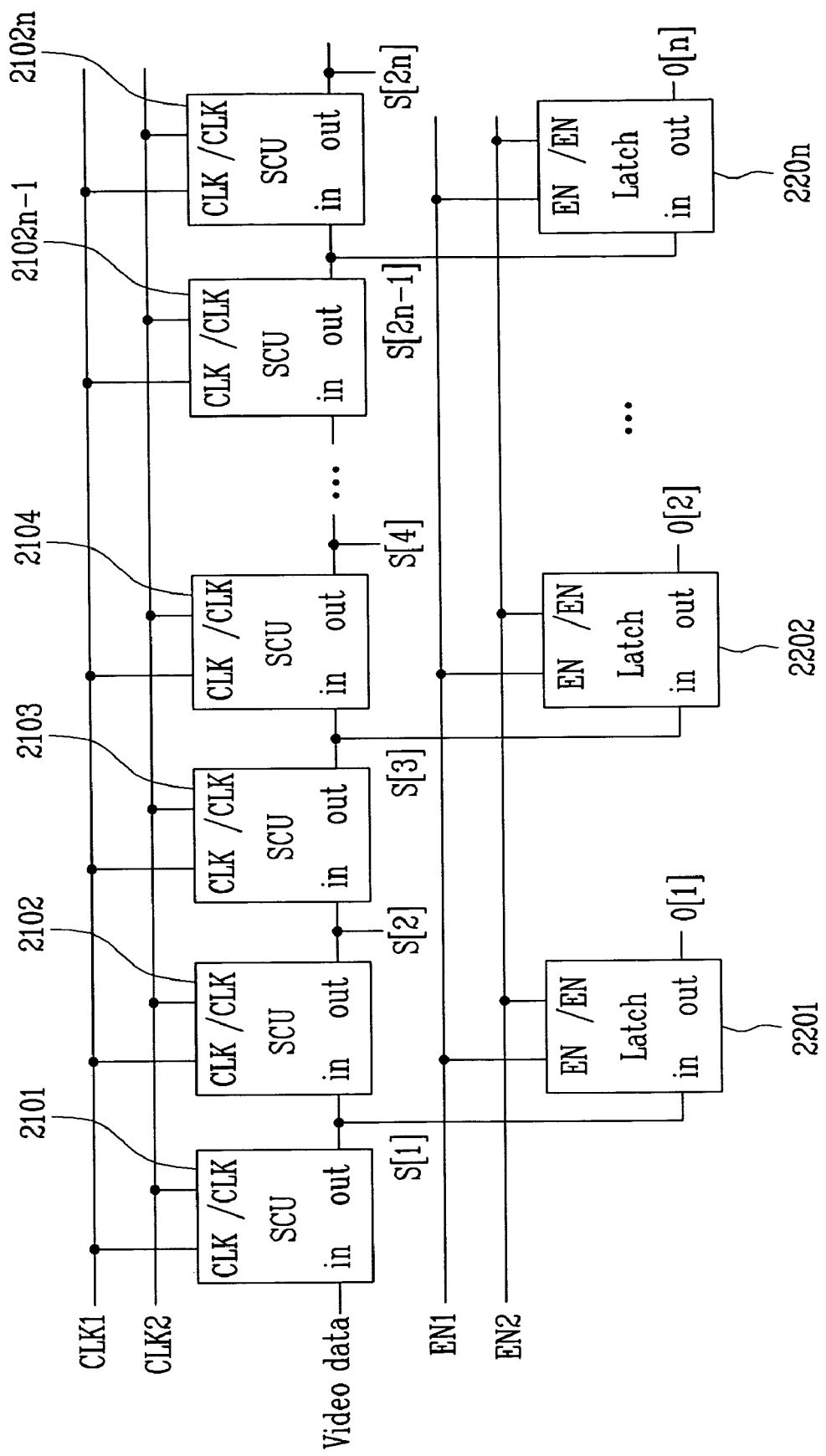
FIG. 6 illustrates a schematic of an exemplary data driving circuit that may be used by the electroluminescent display illustrated in FIG. 3, according to an exemplary embodiment of the present invention.

FIG. 6 illustrates a schematic of another exemplary data driving circuit that may be used with the OLED illustrated in FIG. 3, according to an exemplary embodiment of the present invention. Again, it should be understood that the exemplary data driving circuit should not be limited to the exemplary OLED of FIG. 3. Rather, the exemplary data driving circuit may be used with other electroluminescent displays. Referring to FIG. 6, the data driving circuit 200 may include a shift register and a latch unit.

The shift register may include a plurality of first stages 2101 to 2102n, and each of the first stages may be operated by the first clock (CLK1) and the second clock (CLK2). The first stage 2101 may output the $1^{st}$ carrier wave (s1) and transmit the $1^{st}$ carrier wave (s1) to the $2^{nd}$ first stage 2102 and the $1^{st}$ second stage 2201. Data signals (for example, video data) may be carried and output in the $1^{st}$ carrier wave (s1). Thus, the $2^{nd}$ first stage 2102 may receive the $1^{st}$ carrier wave (s1) and may transmit the $2^{nd}$ carrier wave to a $3^{rd}$ first stage 2103, and then the $3^{rd}$ first stage 2103 may transmit a $3^{rd}$ carrier wave (s3) to the $4^{th}$ first stage and the $2^{nd}$ second stage 2202. That is, the odd-numbered first stages 2001, 2003 . . . 2002n-3, 2002n-1 may transmit carrier waves to the adjacent first stages (the even-numbered first stage 2002, 2004 . . . 2002n-2, 2002n) and the second stages.

The latch unit may include a plurality of the second stages 2201 to 220n, and each of the second stages may be operated by a first enable signal (EN1) and a second enable signal (EN2). The plurality of the second stages 2201 to 220n may be connected to output lines of the odd-numbered first stages 2001, 2003 . . . 2002n-3, 2002n-1 to receive data signals (a1 to an) transmitted from the odd-numbered first stages 2001, 2003 . . . 2002n-3, 2002n-1. Accordingly, a plurality of the second stages 2201 to 220n may have half the number of the plurality of the first stages 2101 to 2102n. Also, each of the second stages may simultaneously output the data signals (for example, video data) based on the first enable signal (EN1) and the second enable signal (EN2). Accordingly, the data signals (for example, video data) may be input in series to a plurality of the first stages 2101 to 2102n and may be output in parallel by a plurality of the second stages 2201 to 220n.

Figure 7:
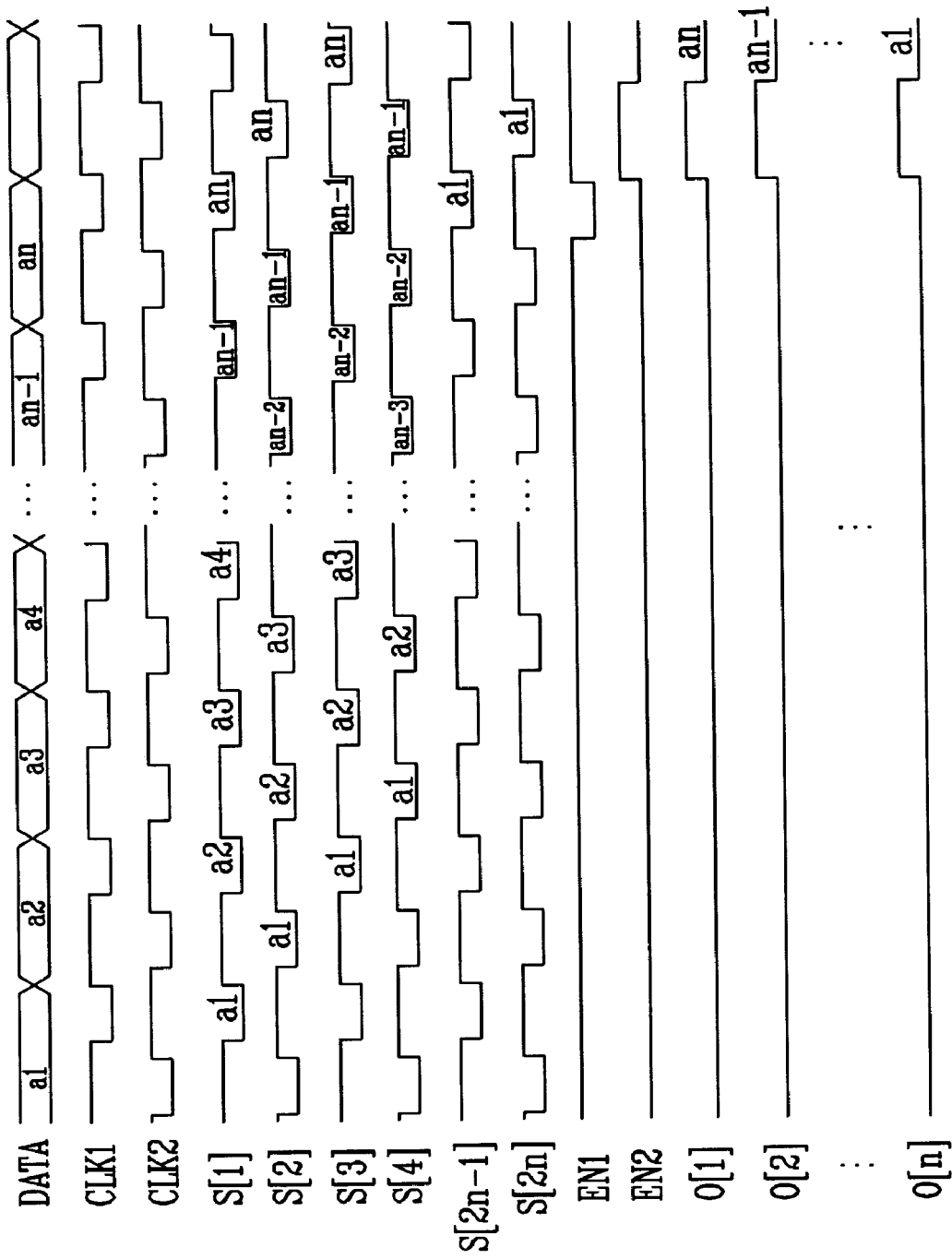
FIG. 7 illustrates a timing diagram of an exemplary operation of the data driving circuit illustrated in FIG. 6.

FIG. 7 illustrates a timing diagram of an exemplary operation of the data driving circuit illustrated in FIG. 6. Referring to FIG. 7, the first clock CLK1 may be a pulse that may be periodically generated and may have a longer high period and a shorter low period. The second clock (CLK2) may be a pulse delayed for a predetermined period compared to the first clock (CLK1) pulse. The carrier wave (s1) that may be output from the $1^{st}$ first stage 2101 may be generated with the same periodicity as the first clock (CLK1), and the carrier wave (s1) may output data (a1) when the signal is at a low level. The carrier wave (s1) may continue to sequentially output a $n^{th}$ data in the $1^{st}$ data (a1).

The $2^{nd}$ first stage 2102 may receive the $1^{st}$ carrier wave (s1) from the $1^{st}$ first stage and may output the $2^{nd}$ carrier wave (s2). The $2^{nd}$ carrier wave (s2) may output the $1^{st}$ data (a1) after the $1^{st}$ data (a1) is delayed for a predetermined time as compared to the $1^{st}$ carrier wave (s[1]), and may sequentially output the data from the $1^{st}$ data (a1) to then $n^{th}$ data (an). In this manner, the nth first stage 2102n may output the $n^{th}$ carrier wave (sn). The first and second enable signals (EN1, EN2) may be input at a point that the $1^{st}$ data (a1) to $n^{th}$ data (an) are output over the $n^{th}$ carrier wave (sn) of the $1^{st}$ carrier wave (s1), and then may be simultaneously output by a plurality of the second stages 2201 to 220n.

Figure 8:
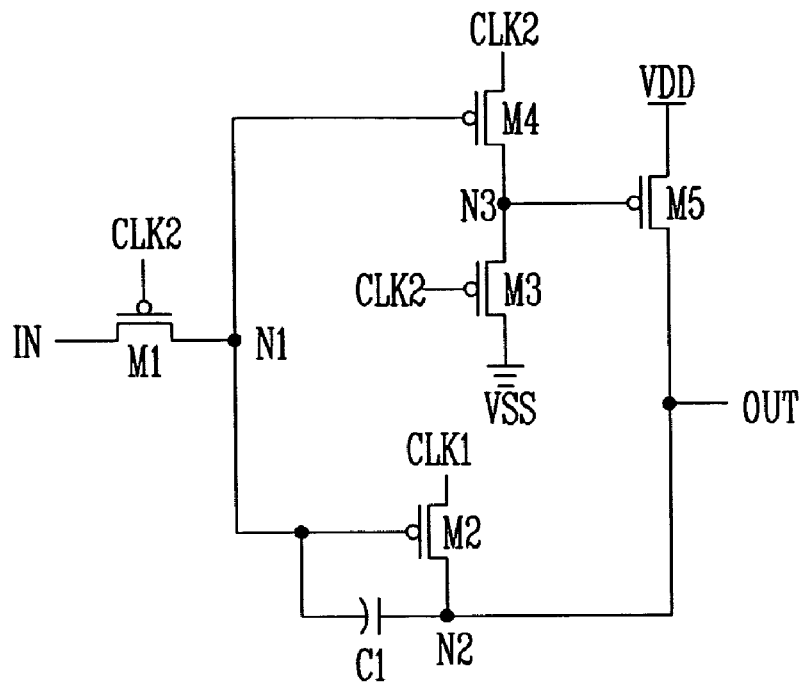
FIG. 8 illustrates a circuit diagram of an exemplary first stage that may be used in the data driving circuits illustrated in FIG. 4 and FIG. 6, according to an exemplary embodiment of the present invention.
Figure 9:
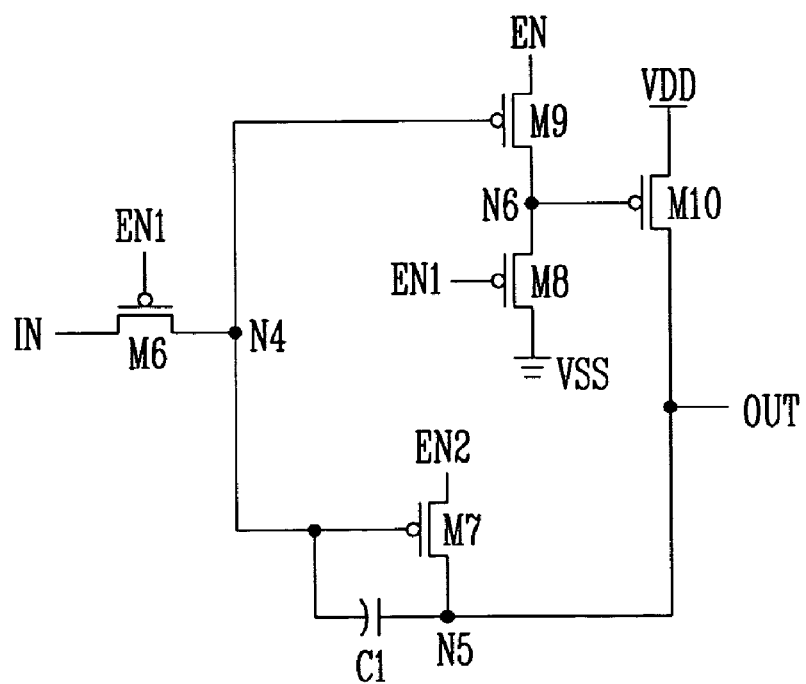
FIG. 9 illustrates a circuit diagram of an exemplary second stage that may be used in the data driving circuits illustrated in FIG. 4 and FIG. 6, according to an exemplary embodiment of the present invention.

FIG. 8 illustrates a circuit diagram of an exemplary first stage that may be used in the data driving circuits illustrated in FIG. 4 and FIG. 6, according to an exemplary embodiment of the present invention. FIG. 9 illustrates a circuit diagram of an exemplary second stage that may be used in the data driving circuits illustrated in FIG. 4 and FIG. 6, according to an exemplary embodiment of the present invention.

Referring to FIG. 8 and FIG. 9, the first and second stages may have the same configuration, except that the first stage may receive a first clock signal (CLK1) and a second clock signal (CLK2), while the second stage may receive a first enable signal (EN1) and a second enable signal (EN2). However, although not illustrated, other implementation may be considered where the first and second stages do not have the same configuration. Also, for purposes of discussion and illustration only, the first stage and the second stage may be realized by PMOS transistors and capacitors. However, other implementations without PMOS transistors and capacitors may be realized.

Since the first stage and the second stage may be connected in a same manner, as discussed above, the first stage and second stage will be described referring to the connection of the first stage only.

Referring to FIG. 8, in the first transistor (M1), a source may be connected to an input terminal (IN), a drain may be connected to a first node (N1) and a gate may be connected to the second clock (CLK2). In the second transistor (M2), a source may be connected to a first clock (CLK1), a drain may be connected to a second node (N2), and a gate may be connected to the first node (N1). In the third transistor (M3), a source may be connected to a third node (N3), a drain may be connected to a second power supply (VSS), and a gate may be connected to the second clock (CLK2). In the fourth transistor (M4), a source may be connected to a second clock (CLK2), a drain may be connected to the third node (N3), and a gate may be connected to the first node (N1). Also in the fifth transistor (M5), a source may be connected to a first power supply (VDD), a drain may be connected to an output terminal (OUT), and a gate may be connected to the third node (N3). Finally, in a capacitor (C1), a first electrode may be connected to the first node (N1), and a second electrode may be connected to the second node (N2). The second node (N2) may also be connected to to the second node (N2). The second node (N2) may also be connected to input terminal (IN) may be stored in the capacitor (C1), and then may be output through the output terminal (OUT) after a predetermined time.

At that time, an output port outputs high level signals and low level signals by a clock and an inverse clock regardless of property deviations of the transistors. Therefore it is possible to decrease malfunction of the data driving circuit.

Figure 10:
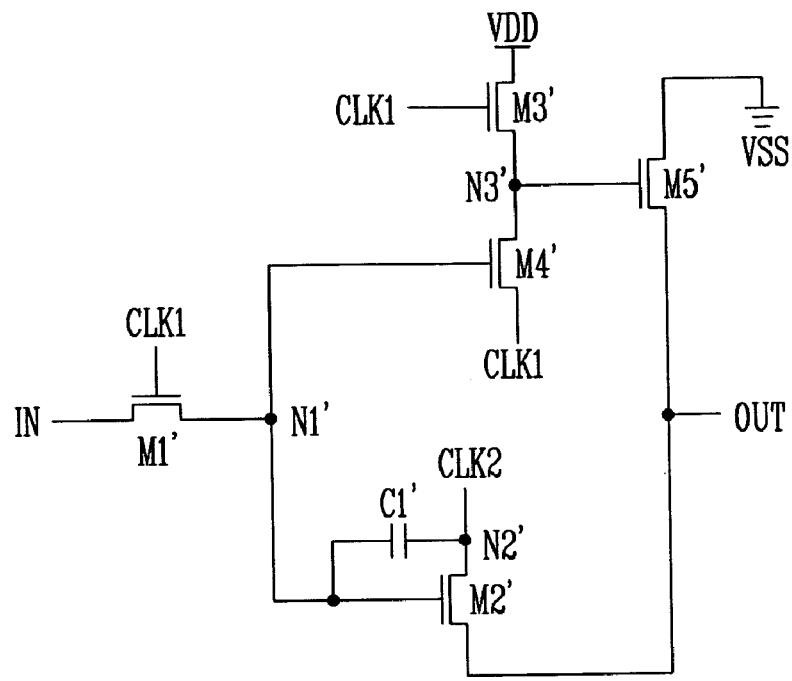
FIG. 10 illustrates a circuit diagram of another exemplary first stage that may be used in the data driving circuits illustrated in FIG. 4 and FIG. 6, according to an exemplary embodiment of the present invention.
Figure 11:
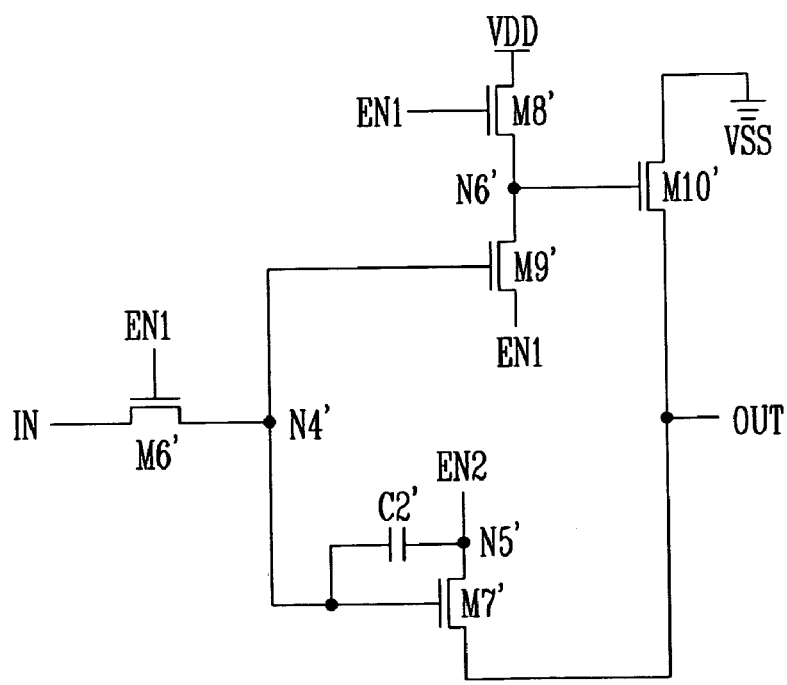
FIG. 11 illustrates a circuit diagram of another exemplary second stage that may be used in the data driving circuits illustrated in FIG. 4 and FIG. 6, according to an exemplary embodiment of the present invention.

FIG. 10 illustrates a circuit diagram of another exemplary first stage that may be used in the data driving circuits illustrated in FIG. 4 and FIG. 6. FIG. 11 illustrates a circuit diagram of another exemplary second stage. Referring to FIG. 10 and FIG. 11, the first and second stages may be realized by NMOS transistors and capacitors. Again, other implementations of the first and second stages may be realized. The first stage may be operated after receiving the first clock signal and the second clock signal, and the second stage may be operated after receiving the first enable signal and the second enable signal.

Figure 12:
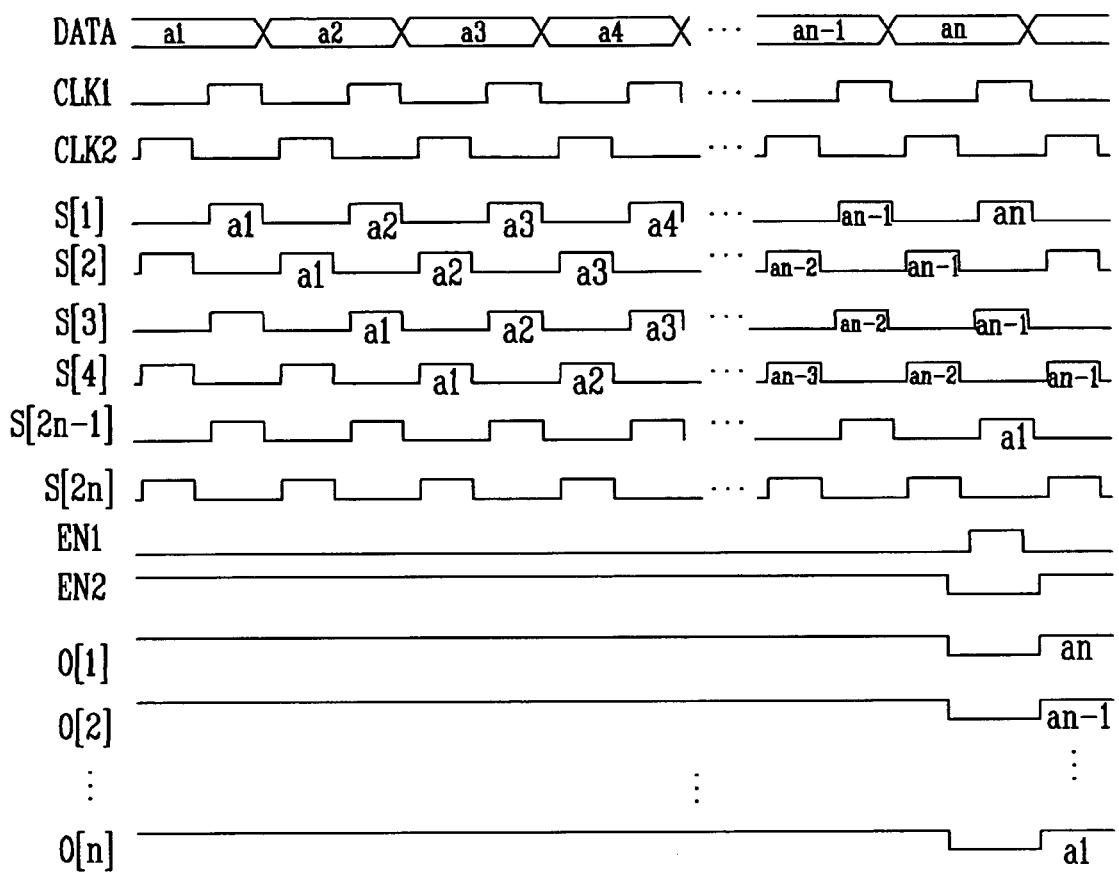
FIG. 12 illustrates a timing diagram of an exemplary operation of the data driving circuit illustrated in FIG. 4, in which the first and second stages illustrated in FIG. 10 and FIG. 11 may be used.
Figure 13:
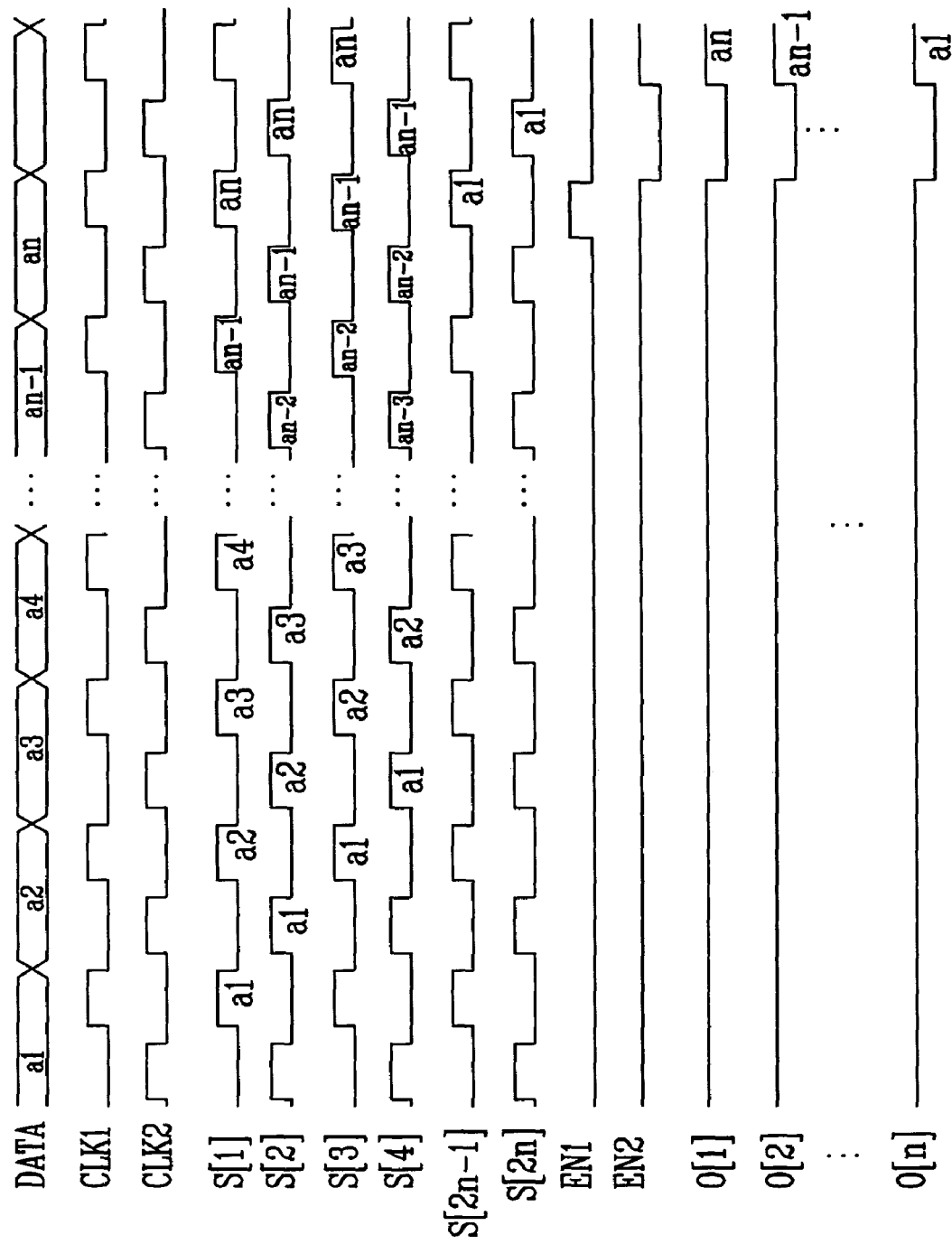
FIG. 13 illustrates a timing diagram of an exemplary operation of the data driving circuit illustrated in FIG. 6, in which the first and second stages illustrated in FIG. 10 and FIG. 11 may be used.

FIG. 12 illustrates a timing diagram of an exemplary operation of the data driving circuit illustrated in FIG. 4, in which the first and second stages illustrated in FIG. 10 and FIG. 11 may be used. FIG. 13 illustrates a timing diagram of an exemplary operation of the data driving circuit illustrated in FIG. 6, in which the first and second stages illustrated in FIG. 10 and FIG. 11 may be used. Referring to FIG. 12 and FIG. 13, waveforms of signals input/output in the first and second stage may be realized by NMOS transistors. The signals may be reversed, and then input into the first and second stages to operate the data driving circuit, as illustrated in FIG. 6. As a result, a description of FIG. 12 and FIG. 13 is identical with that of FIG. 7.

As described above, the data driving circuit according to the present invention has advantages in that it may reduce power consumption by removing paths through which a static current may flow, may minimize a leakage current since the output port may not be recharged when a high-level output may be put through the data driving circuit, and also may increase an operation rate by minimizing reduction of the current that discharges the output port since the bootstrap may be operated when a low-level output is put through the data driving circuit.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A data driving circuit, comprising:
   a shift register unit including a plurality of first stages connected in series and receiving data signals and outputting the data signals, wherein each first stage receives the data signals output from a preceding first stage; and
   a latch unit including a plurality of second stages, wherein each second stage is connected to a different predetermined first stage and receives the data signals output from the predetermined first stage, wherein each of the first stages is connected to a first clock and a second clock and is adapted to receives first clock signals and second clock signals as input, and each of the first stages includes:
      a first transistor connected between an input port and a first node and being turned on based on the second clock;
      a second transistor connected between the first clock and a second node and being turned on based on a voltage of the first node;
      a third transistor connected between a third node and a first power supply and being turned on based on the second clock;
      a fourth transistor connected between the second clock and the third node and being turned on based on the voltage of the first node; and
      a fifth transistor connected between a second power supply and an output port and being turned on based on the voltage of the third node.

2. The data driving circuit as claimed in claim 1, wherein the predetermined first stage is an even-numbered first stage.

3. The data driving circuit as claimed in claim 1, wherein the predetermined first stage is an odd-numbered first stage.

4. The data driving circuit as claimed in claim 1, wherein each of the first stages is adapted to stores data signals when the first and the second clock signals are both high or both low and outputs the stored data signals when the first and the second clock signals are different from each other.

5. The data driving circuit as claimed in claim 4, wherein each first stage further comprises:
   a first capacitor connected between the first node and the output port and maintaining the voltages of the output port and the first node.

6. The data driving circuit as claimed in claim 5, wherein each of the first stages includes PMOS or NMOS transistors.

7. The data driving circuit as claimed in claim 4, wherein the first and the second clock signals include a data-reading period and a data-transmitting period, and the data-reading period is shorter than the data-transmitting period.

8. The data driving circuit as claimed in claim 7, wherein the second clock signal corresponds to a delayed first clock signal.

9. The data driving circuit as claimed in claim 1, wherein each second stage receives a first enable signal and a second enable signal that are input at a same period, wherein each second stage stores data signals when the first and the second enable signals are both high or both low and outputs the stored data signals when the first and the second enable signals are different from each other.

10. The data driving circuit as claimed in claim 9, wherein each second stage comprises:
    a sixth transistor connected between an input port and a fourth node and being turned on based on the first enable signal generator;
    a seventh transistor connected between a second enable signal generator and a fifth node and being turned on based on a voltage of the fourth node;
    an eighth transistor connected between a first power supply and a sixth node and being turned on based on the first enable signal generator;

a ninth transistor connected between the first enable signal generator and the sixth node and being turned on based on the voltage of the fourth node;
a tenth transistor connected between a second power supply and an output port and being turned on based on a voltage of the sixth node; and
a second capacitor connected between the fourth node and the output port, the second capacitor maintaining the voltages of the output port and the fourth node.

11. The data driving circuit as claimed in claim 10, wherein each of the second stages includes PMOS or NMOS transistors.

12. The data driving circuit as claimed in claim 9, wherein the second stages simultaneously output the data signals in parallel based on the first and the second enable signals.

13. The data driving circuit as claimed in claim 12, wherein the first and the second enable signals have waveforms of the first and the second clock signals at an applied point.

14. The data driving circuit as claimed in claim 1, including a D/A converter connected to the latch unit, wherein the D/A converter receives digital data signals from the latch unit and outputs analog data signals.

15. An electroluminescent display, comprising:
a pixel unit including pixels receiving data signals and scan signals;
a data driving circuit transmitting the data signals to the pixels; and
a scan driving circuit transmitting the scan signals to the pixels, wherein the data driving circuit includes:
a shift register unit including a plurality of first stages connected in series and receiving data signals and outputting the data signals, wherein each first stage receives the data signals output from a preceding first stage; and
a latch unit including a plurality of second stages, wherein each second stage is connected to a different predetermined first stage and receives the data signals output from the predetermined first stage, wherein each of the first stages is connected to a first clock and a second clock and is adapted to receives first and second clock signals as input, and each of the first stages includes:
a first transistor connected between an input port and a first node and being turned on based on the second clock;
a second transistor connected between the first clock and second node and being turned on based on a voltage of the first node;
a third transistor connected between a third node and a first power supply and being turned on based on the second clock;
a fourth transistor connected between the second clock and the third node and being turned on based on the voltage of the first node; and
a fifth transistor connected between a second power supply and an output port and being turned on based on the voltage of the third node.

16. The electroluminescent display as claimed in claim 15, wherein the predetermined first stage is an even-numbered first stage.

17. The electroluminescent display as claimed in claim 16, wherein the predetermined first stage is an odd-numbered first stage.

18. The electroluminescent display as claimed in claim 15, wherein each of the first stages is adapted to stores data signals when the first and the second clock signals are both high or both low and outputs the stored data signals when the first and the second clock signals are different from each other.

19. The electroluminescent display as claimed in claim 18, wherein each first stage further comprises:
a first capacitor connected between the first node and the output port and maintaining the voltages of the output port and the first node.

20. The electroluminescent display as claimed in claim 18, wherein the first and the second clock signals include a data-reading period and a data-transmitting period, and the data-reading period is shorter than the data-transmitting period.

21. The electroluminescent display as claimed in claim 20, wherein the second clock signal corresponds to a delayed first clock signal.

22. The electroluminescent display as claimed in claim 15, wherein each second stage receives a first enable signal and a second enable signal that are input at a same period, wherein each second stage stores data signals when the first and the second enable signals are both high or both low and outputs the stored data signals when the first and the second enable signals are different from each other.

23. The electroluminescent display as claimed in claim 22, wherein the second stage comprises:
a sixth transistor connected between an input port and a fourth node and being turned on based on the first enable signal generator;
a seventh transistor connected between a second enable signal generator and a fifth node and being turned on based on a voltage of the fourth node;
an eighth transistor connected between a first power supply and a sixth node and being turned on based on the first enable signal generator;
a ninth transistor connected between the first enable signal generator and the sixth node and being turned on based on the voltage of the fourth node;
a tenth transistor connected between a second power supply and an output port and being turned on based on a voltage of the sixth node; and
a second capacitor connected between the fourth node and the output port, the second capacitor maintaining the voltages of the output port and the fourth node.

24. The electroluminescent display as claimed in claim 22, wherein the second stages simultaneously output the data signals in parallel based on the first and the second enable signals.

* * * * *